US010750625B2

(12) United States Patent
Park

(10) Patent No.: US 10,750,625 B2
(45) Date of Patent: Aug. 18, 2020

(54) ROLLABLE DISPLAY DEVICE

(71) Applicant: LG Display Co., Ltd., Seoul (KR)

(72) Inventor: JongHee Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/584,245

(22) Filed: Sep. 26, 2019

(65) Prior Publication Data

US 2020/0107458 A1    Apr. 2, 2020

(30) Foreign Application Priority Data

Sep. 28, 2018 (KR) .................. 10-2018-0116014

(51) Int. Cl.
| | |
|---|---|
| *H05K 5/00* | (2006.01) |
| *H05K 1/02* | (2006.01) |
| *H05K 1/14* | (2006.01) |
| *H05K 1/18* | (2006.01) |
| *H05K 5/02* | (2006.01) |
| *H05K 7/20* | (2006.01) |
| *G09G 3/3208* | (2016.01) |
| *H01L 51/52* | (2006.01) |

(52) U.S. Cl.
CPC ......... *H05K 5/0017* (2013.01); *H05K 1/0203* (2013.01); *H05K 1/142* (2013.01); *H05K 1/147* (2013.01); *H05K 1/189* (2013.01); *H05K 5/0217* (2013.01); *H05K 7/20963* (2013.01); *G09G 3/3208* (2013.01); *G09G 2310/0243* (2013.01); *G09G 2380/02* (2013.01); *H01L 51/529* (2013.01); *H01L 51/5237* (2013.01); *H01L 2251/5338* (2013.01); *H05K 2201/042* (2013.01); *H05K 2201/066* (2013.01); *H05K 2201/10128* (2013.01)

(58) Field of Classification Search
CPC .... H05K 5/0017; H05K 1/0203; H05K 1/142; H05K 1/147; H05K 1/189; H05K 5/0217; H05K 7/20963; H05K 2201/042; H05K 2201/066; H05K 2201/10128; G09G 3/3208; G09G 2310/0243; G09G 2380/02; H01L 51/5237; H01L 51/529; H01L 2251/5338
See application file for complete search history.

(56) References Cited

U.S. PATENT DOCUMENTS

| | | | |
|---|---|---|---|
| 9,098,241 B1 * | 8/2015 | Cho ................... | H05K 1/028 |
| 9,370,094 B2 * | 6/2016 | Miyaguchi ............ | H05K 1/028 |

(Continued)

*Primary Examiner* — Jayprakash N Gandhi
*Assistant Examiner* — Michael A Matey
(74) *Attorney, Agent, or Firm* — Fenwick & West LLP

(57) ABSTRACT

A rollable display device includes a display panel, a roller, a heat-dissipating member, a source circuit board, and a control circuit board. The display panel has the flexible characteristic. The roller winds or unwinds the display panel. The heat-dissipating member is coupled with the display panel to be received inside the roller. The source circuit board is electrically connected to the display panel, and the source circuit board is disposed on the heat-dissipating member to be received inside the roller. The control circuit board is electrically connected to the source circuit board to provide a control signal to the source circuit board side, and the control circuit board is disposed on the heat-dissipating member to be received inside the roller.

15 Claims, 10 Drawing Sheets

(56) References Cited

U.S. PATENT DOCUMENTS

| | | | | |
|---|---|---|---|---|
| 9,560,750 B2* | 1/2017 | Lee | ................ | G06F 1/1652 |
| 9,756,757 B2* | 9/2017 | Park | ................ | H05K 7/16 |
| 10,254,573 B2* | 4/2019 | Kwon | ................ | G02F 1/133305 |
| 10,254,797 B2* | 4/2019 | Lee | ................ | G06F 1/1658 |
| 10,586,475 B2* | 3/2020 | Park | ................ | G06F 1/1652 |
| 10,599,185 B2* | 3/2020 | Yu | ................ | G06F 1/1652 |
| 2010/0182288 A1* | 7/2010 | Misawa | ................ | G02F 1/133305 |
| | | | | 345/204 |
| 2014/0194165 A1* | 7/2014 | Hwang | ................ | G06F 1/1677 |
| | | | | 455/566 |
| 2014/0362512 A1* | 12/2014 | Hinson | ................ | G06F 15/025 |
| | | | | 361/679.21 |
| 2015/0009613 A1* | 1/2015 | Morita | ................ | G06F 1/1652 |
| | | | | 361/679.26 |
| 2016/0054758 A1* | 2/2016 | Han | ................ | G06F 1/1652 |
| | | | | 361/679.26 |
| 2016/0139633 A1* | 5/2016 | Lee | ................ | G06F 1/1652 |
| | | | | 345/33 |
| 2016/0187929 A1* | 6/2016 | Kim | ................ | G06F 1/1652 |
| | | | | 345/184 |
| 2016/0209879 A1* | 7/2016 | Ryu | ................ | G06F 1/1601 |
| 2016/0363960 A1* | 12/2016 | Park | ................ | G06F 1/1656 |
| 2017/0156225 A1* | 6/2017 | Heo | ................ | G09F 9/301 |
| 2017/0318689 A1* | 11/2017 | Kim | ................ | G03B 21/58 |
| 2017/0373269 A1* | 12/2017 | Seo | ................ | H05K 7/20954 |
| 2018/0014417 A1* | 1/2018 | Seo | ................ | H05K 5/0017 |
| 2019/0130796 A1* | 5/2019 | Kang | ................ | H01L 51/0097 |
| 2019/0138058 A1* | 5/2019 | Kwon | ................ | G09F 9/301 |
| 2019/0181378 A1* | 6/2019 | Song | ................ | H01L 51/5253 |
| 2019/0383474 A1* | 12/2019 | Vasylyev | ................ | F21V 9/08 |

* cited by examiner

ROLLABLE DISPLAY DEVICE

CROSS-REFERENCE TO RELATED APPLICATIONS

This application claims priority to Republic of Korea Patent Application No. 10-2018-0116014, filed on Sep. 28, 2018, the disclosure of which is incorporated by reference in its entirety.

BACKGROUND

Field of the Disclosure

The present disclosure relates to a rollable display device, and more particularly, to a rollable display device having a structure in which a flexible display panel is wound or unwound by a roller.

Description of the Related Art

In recent years, various types of flexible display devices have been developed in order to enhance convenience for the use of the user. Generally, such a flexible display device is being developed as a portable display device, and the flexible display device includes a display panel having flexible characteristics.

The flexible display device includes a foldable display device and a rollable display device that enhance the portability of the user. The foldable display device has a structural characteristic in which a part of the flexible display panel is folded, and the rollable display device has a structural characteristic in which the flexible display panel is wound around or unwound from the roller.

SUMMARY

An object of the present disclosure is to provide a rollable display device, which can have a slim design, and easily radiate the heat generated during driving of a flexible display panel to the outside.

A rollable display device for achieving the object of the present disclosure described above includes a display panel, a roller, a heat-dissipating member, a source circuit board, and a control circuit board. The display panel has the flexible characteristic. The roller winds or unwinds the display panel. The heat-dissipating member is coupled with the display panel to be received inside the roller. The source circuit board is electrically connected to the display panel, and the source circuit board is disposed on the heat-dissipating member to be received inside the roller. The control circuit board is electrically connected to the source circuit board to provide a control signal to the source circuit board side, and the control circuit board is disposed on the heat-dissipating member to be received inside the roller.

DETAILED DESCRIPTION

Figure 1:
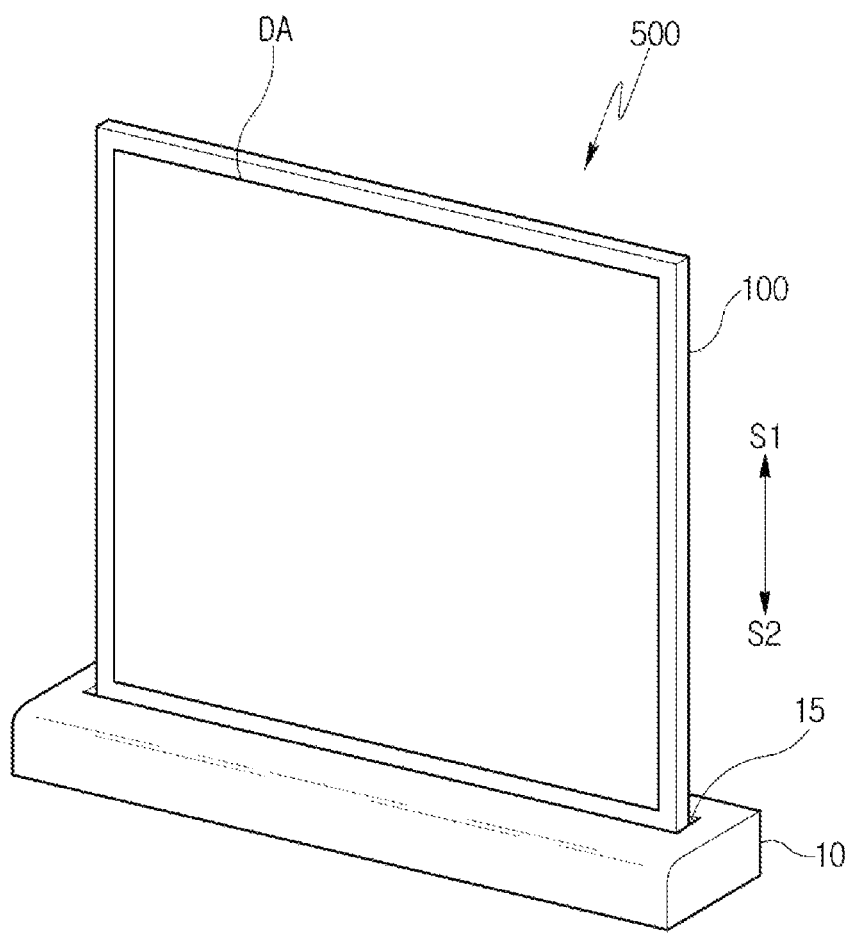
FIG. 1 is a perspective diagram of a rollable display device according to an embodiment of the present disclosure.

Hereinafter, embodiments of the present disclosure will be described in detail with reference to the accompanying drawings. The above objects, features, and advantages of the present disclosure will be understood through the following embodiments with reference to the accompanying drawings. However, the present disclosure is not limited to the embodiments disclosed herein and can be modified in various forms. The embodiments of the present disclosure, which will be described below, are provided to clarify the technical spirit of the present disclosure and also to fully transfer the technical spirit thereof to those skilled in the art to which the present disclosure pertains. Therefore, the scope of the present disclosure should not be construed as being limited to embodiments which will be described below. In the following embodiments and the drawings, the same reference numerals denote the same components.

In addition, throughout this disclosure, terms such as a "first," "second," and the like are used not for limitative but for the purpose of distinguishing one component from another component. In addition, when a portion of a film, a region, a component, or the like is referred to as being "on" another portion, this includes not only a case in which the portion is "directly on" another portion but also a case in which another film, another region, another component, or the like is interposed between the portion and another portion.

Figure 2:
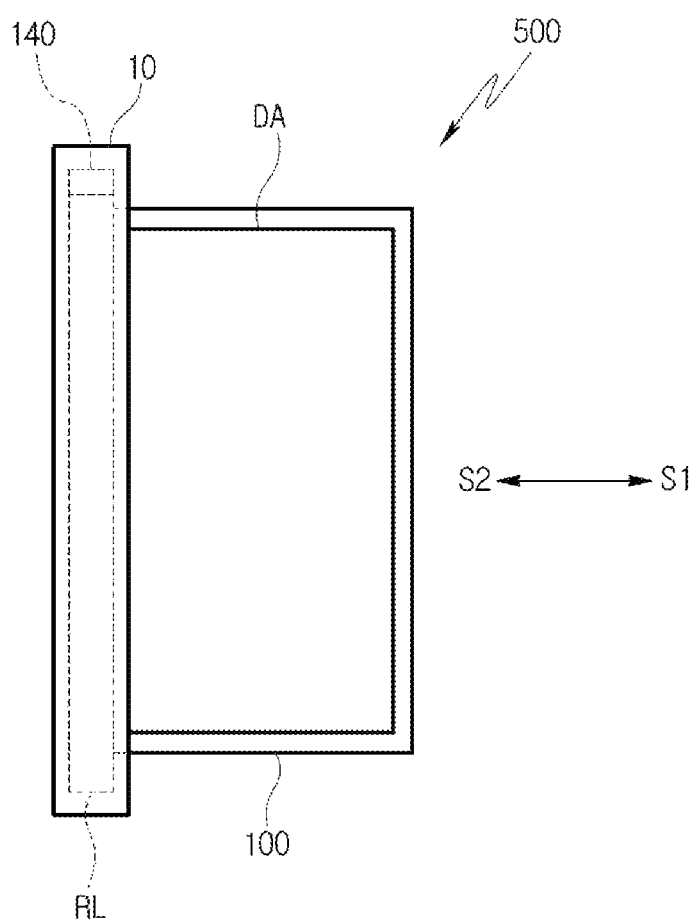
FIG. 2 is a plane diagram of the rollable display device illustrated in FIG. 1 according to an embodiment of the present disclosure.

FIG. 1 is a perspective diagram of a rollable display device 500 according to an embodiment of the present disclosure. FIG. 2 is a plane diagram of the rollable display device 500 illustrated in FIG. 1, and FIG. 2 illustrates a plane diagram of the rollable display device 500 in a state where a part of a display panel 100 is wound by a roller RL.

Referring to FIGS. 1 and 2, the rollable display device 500 includes a housing 10, a roller RL, the display panel 100, and a driving part 140.

The housing 10 receives the roller RL and the driving part 140. A slot 15 having a shape extending in the longitudinal direction of the housing 10 is formed in the housing 10. Therefore, when the display panel 100 is unwound from the roller RL in the unwinding direction S1 (e.g., from a state where the display panel 100 is wound around the roller RL), the area of the display region DA of the display panel 100 exposed to the outside can be expanded.

Conversely, when the driving part 140 is driven and the roller RL winds the display panel 100 in the winding direction S2, the area of the display region DA of the display panel 100 exposed to the outside can be reduced. In addition, in a state where the display panel 100 has been mostly wound around the roller RL, the display panel 100 can be received inside the housing 10.

The roller RL is coupled with one side portion of the display panel 100 to be received inside the housing 10. In addition, the roller RL can be rotated by the rotational force provided from the driving part 140, and can wind or unwind the display panel 100 according to the direction in which the roller RL rotates. For example, the display panel 100 can be wound around the roller RL when the roller RL rotates clockwise, and the display panel 100 can be unwound from the roller RL when the roller RL rotates counterclockwise.

The display panel 100 displays an image through the display region DA. In this embodiment, the display panel 100 can have the flexible characteristic, and the display panel 100 can be an organic light emitting display panel.

In this embodiment, the display panel 100 can include a base board (not illustrated) and a plurality of pixels (not illustrated) disposed on the base board. The base board can have the flexible characteristic like a plastic board. Each of the plurality of pixels includes an anode, an organic light emitting layer disposed on the anode to emit color light, and a cathode disposed on the organic light emitting layer, and the display panel 100 displays the image by using the light outputted from the organic light emitting layer of each of the plurality of pixels.

Meanwhile, in this embodiment, although the display panel 100 can have the above-described structure, the present disclosure is not limited to the structure of the plurality of pixels of the display panel 100. For example, in another embodiment, the plurality of pixels of the display panel 100 can include an organic light emitting layer that emits white light instead of the organic light emitting layer that emits color light, and in this case, the plurality of pixels can further include color filters for filtering white light with color light.

The driving part 140 is received inside the housing 10, and the driving part 140 generates the rotational force for rotating the roller RL by using a power source provided from the outside. In this embodiment, the driving part 140 includes a motor (141 in FIG. 4), and an operation of the driving part 140 can be interlocked with the operations of an elevating part (150 in FIG. 3) and the link part (121 in FIG. 3). More specifically, the operations of the driving part 140, the elevating part (150 in FIG. 3), and the link part (121 in FIG. 3) are interlocked with each other so that the display panel 100 can be kept in a standing state where the display panel 100 has been unwound in the unwinding direction S1 and a rolling state where the display panel 100 has been wound in the winding direction S2.

Meanwhile, as described above, in this embodiment, the standing state and the rolling state of the display panel 100 are implemented by a configuration of the driving part 140, the elevating part (150 in FIG. 3), and the link part (121 in FIG. 3), but the present disclosure is not limited to these configurations. For example, in another embodiment, the standing state and the rolling state of the display panel 100 can also have a plurality of divided structures to be kept by a plurality of back bars for supporting the back surface of the display panel 100. Hereinafter, a configuration for keeping the standing state and the rolling state of the display panel 100 according to this embodiment will be described as follows.

Figure 3:
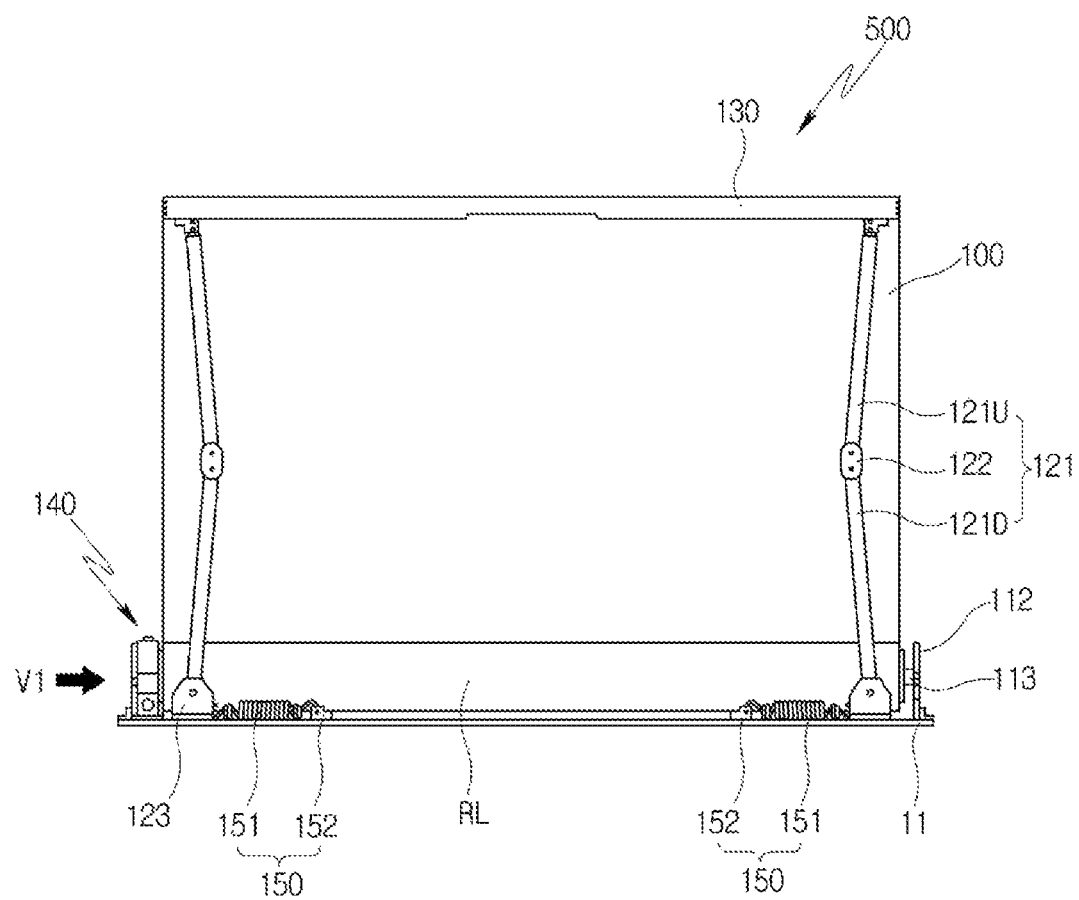
FIG. 3 is a rear diagram of the rollable display device for explaining a configuration of keeping a standing state and a rolling state of a display panel according to an embodiment of the present disclosure.
Figure 4:
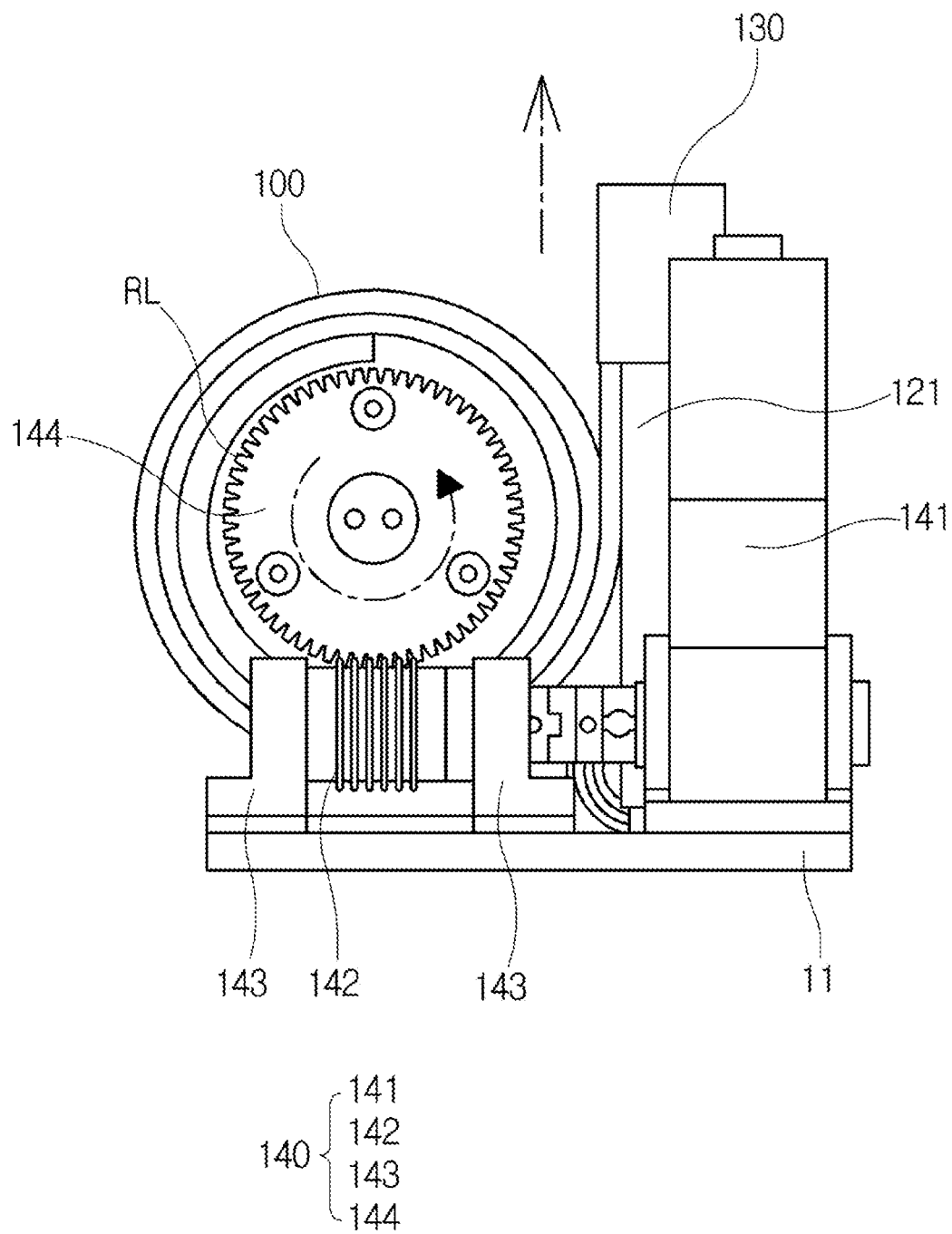
FIG. 4 is an enlarged diagram of a driving part illustrated in FIG. 3 according to an embodiment of the present disclosure.
Figure 5:
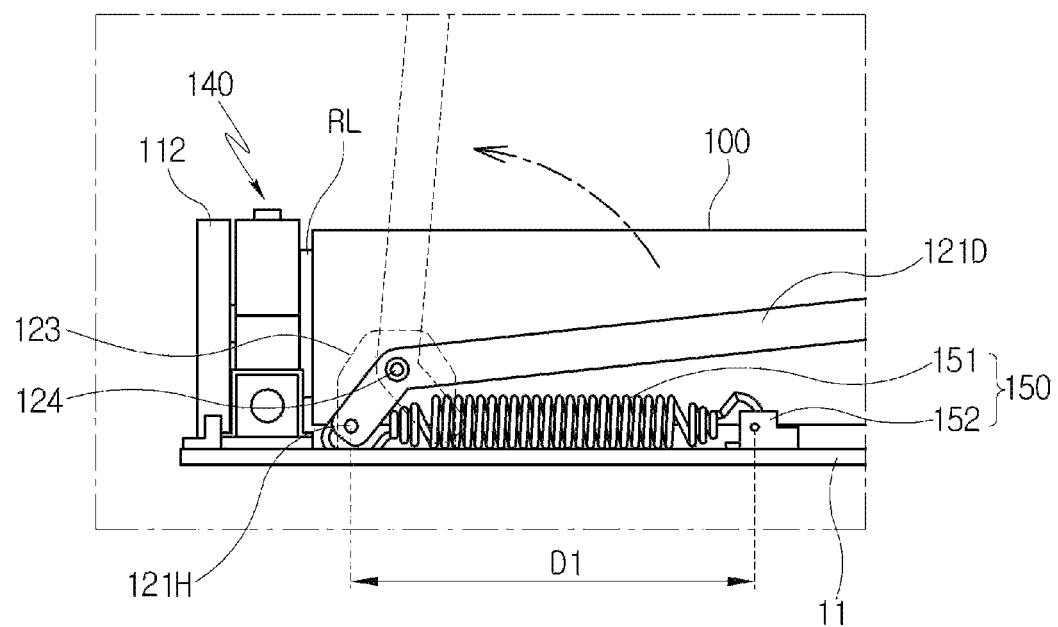
FIG. 5 is a diagram for explaining an operation of a link part illustrated in FIG. 3 according to an embodiment of the present disclosure.

FIG. 3 is a rear diagram of the rollable display device 500 for explaining a configuration of keeping a standing state and a rolling state of the display panel 100 according to an embodiment of the present disclosure. FIG. 4 is an enlarged diagram of a driving part 140 illustrated in FIG. 3, and more specifically, FIG. 4 is an enlarged diagram of the driving part 140 when viewed from a first viewing direction V1. FIG. 5 is a diagram for explaining an operation of the link part illustrated in FIG. 3.

Meanwhile, each of FIGS. 3, 4, and 5 illustrates a housing bottom part 11, which is a portion of the housing (10 in FIG. 1) instead of the housing (10 in FIG. 1) illustrated in FIG. 1 in order to more clearly illustrate the components of the rollable display device 500.

Figure 6A:
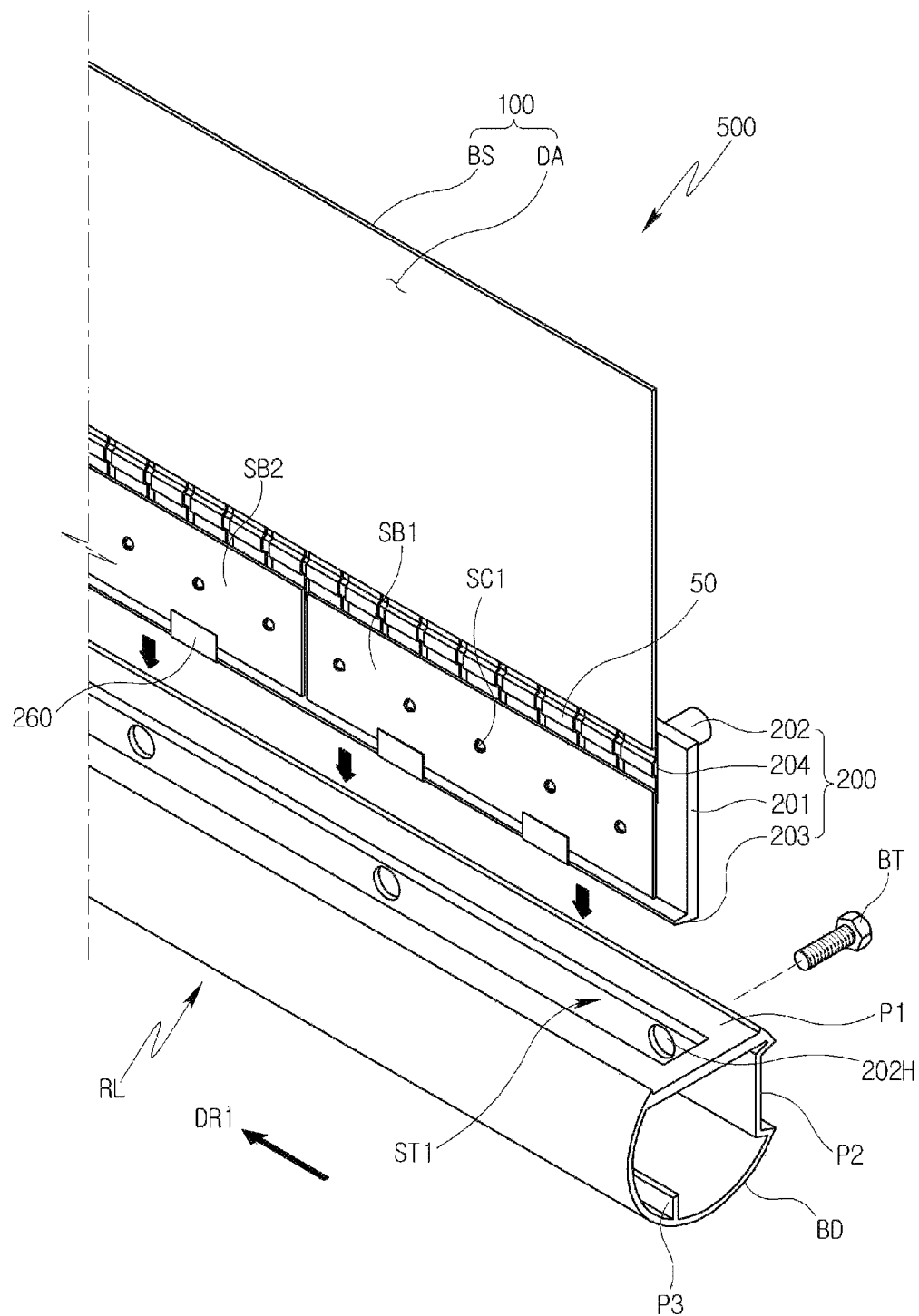
FIGS. 6A and 6B are diagrams illustrating a procedure in which a heat-dissipating member coupled to a plurality of source circuit boards and a plurality of control circuit boards electrically connected to the display panel illustrated in FIG. 3 is received inside a roller according to an embodiment of the present disclosure.

Referring to FIGS. 3, 4, and 5, the roller RL rotates to unwind or wind the display panel 100. In this embodiment, as illustrated in FIG. 6A, the roller RL can have a hollow shape, and the lower edge of the display panel 100 can be fixed to the roller RL.

A roller support part 112 is disposed at both ends of the roller RL, and a roller shaft 113 is coupled to each of both ends of the roller RL. In addition, the roller shaft 113 is rotatably coupled with the roller support part 112. More specifically, the roller support part 112 is disposed on the housing bottom part 11, and the roller shaft 113 is coupled to the upper end of the side portion of the roller support part 112. Therefore, the roller RL can be spaced apart from the housing bottom part 11 by the coupling structure between the roller support part 112 and the roller shaft 113 described above, and as a result, when the roller RL rotates, the roller RL and the display panel 100 wound around the roller RL can be prevented from interfering with the housing bottom part 11.

The link parts 121 are coupled to both sides of the display panel 100 to have one-to-one correspondence therebetween, and the link parts 121 support the display panel 100 to keep the standing state of the display panel 100 unwound from the roller RL. In this embodiment, each of the link parts 121 includes an upper link 121U, a lower link 121D, a link connection part 122, a link support part 123, and a support shaft 124.

One end of the upper link 121U is rotatably coupled to the upper edge of the display panel 100. In this embodiment, one end of the upper link 121U can be rotatably coupled to a head bar 130 fixed to the upper edge of the display panel 100, and the display panel 100 can be connected to the upper link 121U by the head bar 130. Therefore, as illustrated in FIG. 5, the upper link 121U can be spread upward as the lower link 121D rotates, and the head bar 130 coupled to the upper link 121U and the display panel 100 coupled to the head bar 130 can be interlocked with the movement of the upper link 121U to be spread upward.

The other end of the upper link 121U is rotatably connected to one end of the lower link 121D. In this embodiment, gears rotatably coupled to each other can be provided at the other end of the upper link 121U and one end of the lower link 121D.

The link connection part 122 is disposed at a portion where the upper link 121U and the lower link 121D are connected to each other. As described above, when the upper link 121U and the lower link 121D are connected to be rotatable with each other by the gears, each shaft of the gears can be connected to the link connection part 122.

Therefore, the upper link 121U and the lower link 121D can be spread so that the angle between the upper link 121U and the lower link 121D becomes larger around the link connection part 122, and in this case, the standing state of the display panel 100 can be kept by the upper link 121U and the lower link 121D. In addition, the upper link 121U and the lower link 121D can be folded so that the angle between the upper link 121U and the lower link 121D becomes smaller around the link connection part 122, and in this case, the rolling state of the display panel 100 can be kept by the upper link 121U and the lower link 121D.

The other end of the lower link 121D is rotatably coupled with the support shaft 124 of the link support part 123 fixed on the housing bottom part 11. Therefore, like the direction of the arrow illustrated in FIG. 5, the lower link 121D is rotated around the support shaft 124 so that the lower link 121D can be spread upward.

The link support part 123 is fixed on the housing bottom part 11, and the support shaft 124 protrudes from the link support part 123 to be spaced apart from the housing bottom part 11. Therefore, the lower link 121D can be prevented from interfering with the housing bottom part 11 at the rotation operation of the lower link 121D with respect to the above-described support shaft 124.

The driving part 140 generates the rotational force for rotating the roller RL. In this embodiment, the driving part 140 includes a motor 141, a worm gear 142, a worm gear support part 143, and a worm wheel 144.

The motor 141 generates a rotational force by using the power provided from the outside. The roller RL can be rotated clockwise or counterclockwise according to the direction of the rotational force of the motor 141. In order to transfer the rotational force generated from the motor 141 to the roller RL, the worm gear 142 and the worm wheel 144 are disposed between the motor 141 and the roller RL, and the worm gear 142 and the worm wheel 144 transfers the rotational force generated from the motor 141 to the roller RL side.

In this embodiment, teeth are formed on the outer circumferential surface of each of the worm gear 142 and the worm wheel 144, and can be disposed so that the teeth of the worm gear 142 and the teeth of the worm wheel 144 are engaged with each other. The worm gear 142 can rotate clockwise or counterclockwise around the shaft of the worm gear 142 by the rotational force generated from the motor 141, and the worm wheel 144 coupled to the worm gear 142 in a saw tooth structure can rotate clockwise or counterclockwise around the shaft of the worm wheel 144.

The worm gear support part 143 is disposed at both ends of the worm gear 142. The worm gear support part 143 is disposed on the housing bottom part 11, and the worm gear 142 can be rotatably coupled to both ends of the worm gear support part 143.

The worm wheel 144 can be fixed to the roller shaft 113. Therefore, the roller RL can be rotated clockwise or counterclockwise as the worm wheel 144 rotates.

As described above, although the worm gear 142 and the worm wheel 144 has been used as components for transferring the rotational force of the motor 141 to the roller RL side in this embodiment, other members such as a chain or a belt can be used instead of the worm gear 142 and the worm wheel 144 so that the rotational force of the motor 141 can be transferred to the roller RL side.

The elevating part 150 is connected to the link parts 121 to apply an elastic force to the link parts 121 side so that the link parts 121 can be elevated. In this embodiment, the elevating part 150 includes an elastic member 151 and an elastic member fixing part 152.

The elastic member 151 is disposed outside the roller RL to be connected to each of the link parts 121. In this embodiment, the elastic member 151 can have the elastic force like a spring, and the elastic member 151 applies the elastic force to each of the link parts 121 so that each of the link parts 121 is spread upward.

More specifically, one end of the elastic member 151 is connected to the other end of the lower link 121D in order to be rotatable with respect to the lower link 121D. In this embodiment, one end of the elastic member 151 is inserted into a hole 121H formed at the other end of the lower link 121D so that the other end of the lower link 121D can be rotated by the elastic force of the elastic member 151.

In addition, the other end of the elastic member 151 is connected to the elastic member fixing part 152. More specifically, the elastic member fixing part 152 is fixed to the housing bottom part 11, and the other end of the elastic member 151 can be connected to the elastic member fixing part 152. The elastic member 151 can be contracted or expanded based on the elastic member fixing part 152, and as illustrated in FIG. 5, the other end of the lower link 121D connected to one end of the elastic member 151 can rotate according to the contraction or the expansion of the elastic member 151.

Therefore, as a result of the movement of the lower link 121D that is rotated by being interlocked with the contraction and the expansion of the elastic member 151, the link parts 121 are spread so that the angle between the upper link 121U and the lower link 121D becomes larger, thereby keeping the standing state of the display panel 100, and the link parts 121 are folded so that the angle between the upper link 121U and the lower link 121D becomes smaller, thereby keeping the rolling state of the display panel 100.

Meanwhile, in this embodiment, the heat-dissipating member coupled to the source circuit boards and the control circuit boards for generating a data signal and a control signal for driving the display panel 100 is received inside the roller RL, such that the volume of the rollable display device 500 is reduced, and at the same time, the heat-dissipating effect of the rollable display device 500 can be implemented. This will be described in detail with reference to FIGS. 6A, 6B, and 7 as follows.

Figure 6B:
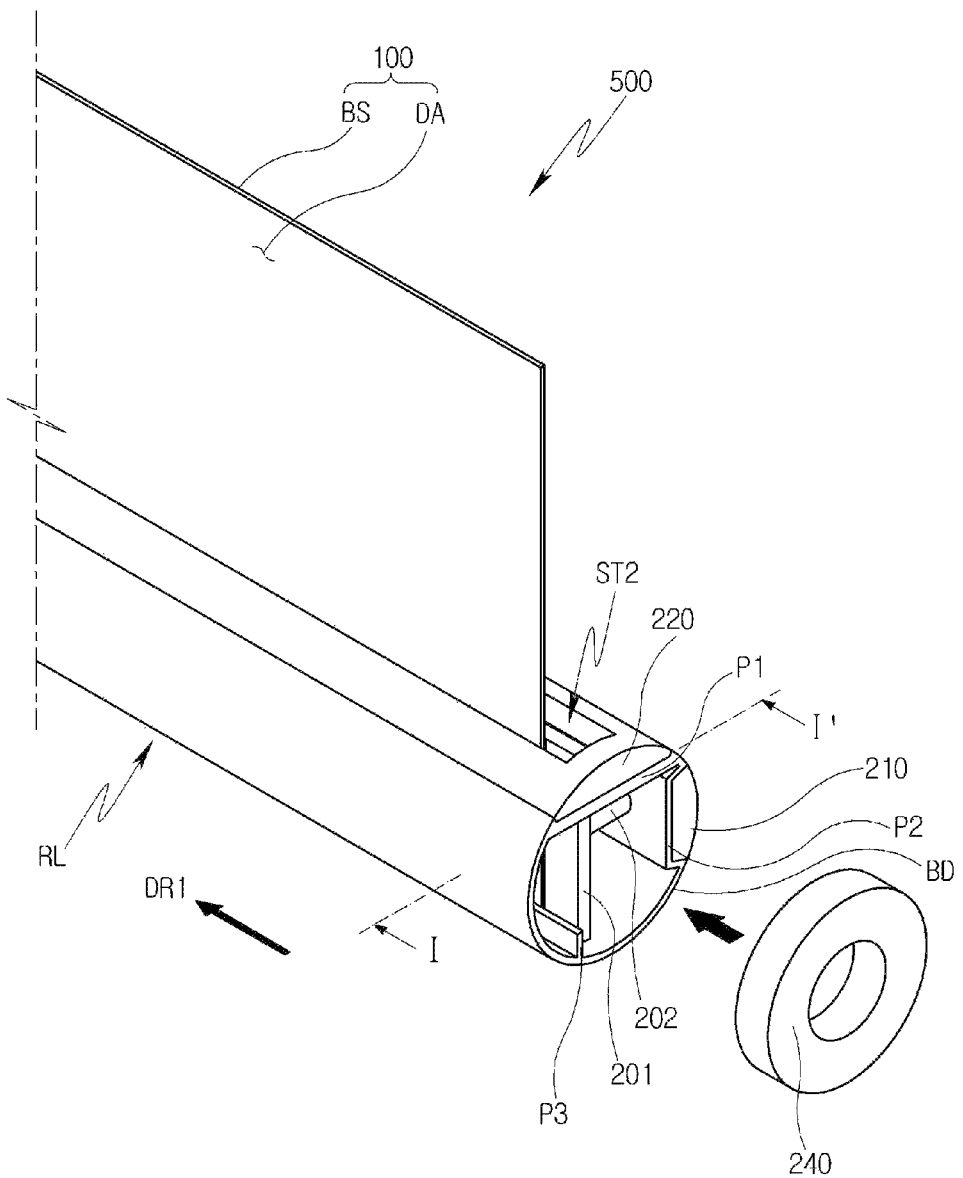
Figure 7:
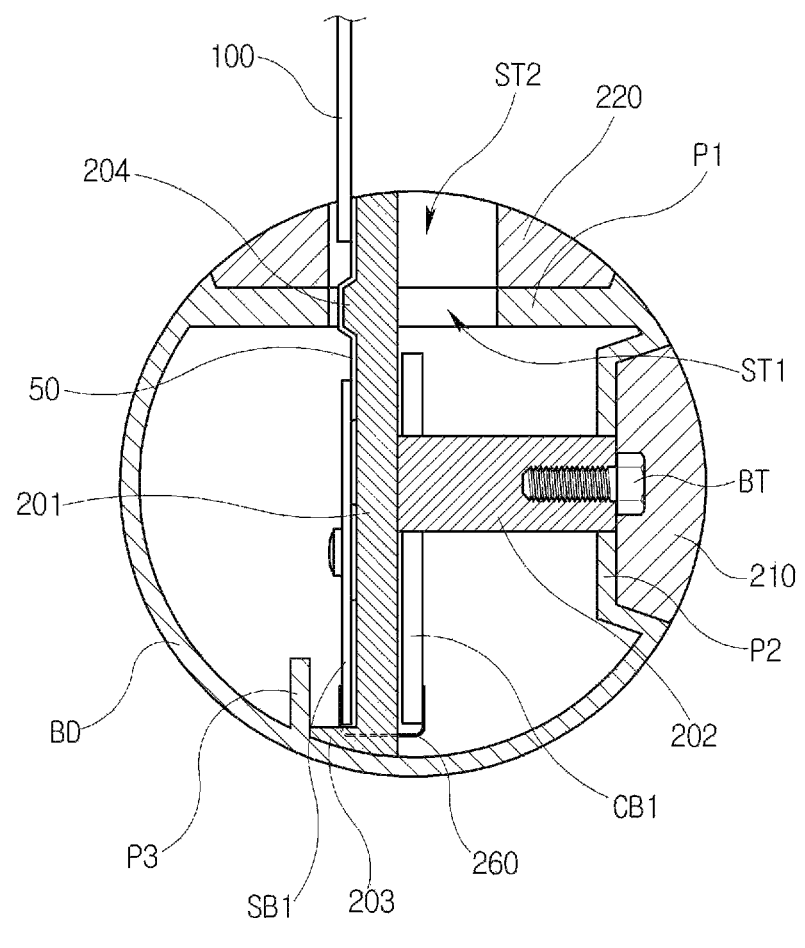
FIG. 7 is a cross-sectional diagram illustrating the surface taken along the line I-I' illustrated in FIG. 6B according to an embodiment of the present disclosure.

FIGS. 6A and 6B are diagrams illustrating a procedure in which a heat-dissipating member coupled to a plurality of source circuit boards and a plurality of control circuit boards electrically connected to the display panel 100 illustrated in FIG. 3 is received inside the roller. FIG. 7 is a cross-sectional diagram illustrating the surface taken along the line I-I' illustrated in FIG. 6B.

Meanwhile, FIGS. 6A and 6B are provided to more clearly illustrate the structure and the coupling relationship of the components of the rollable display device 500, and the present disclosure is not limited to the assembling order of the components of the rollable display device 500 illustrated in FIGS. 6A and 6B. In addition, the above-described components are denoted by the same reference numerals, and a redundant description of the components is omitted.

Referring to FIGS. 6A, 6B, and 7, the rollable display device 500 includes the display panel 100, the roller RL, a heat-dissipating member 200, a first cover part 220, a second cover part 210, a third cover part 240, the plurality of source circuit boards, the plurality of control circuit boards, a plurality of flexible printed circuit boards 50, a first connection member FB, and a plurality of second connection members 260.

In this embodiment, the display panel 100 has the flexible characteristic, and the display panel 100 can be an organic light emitting display panel. One side edge of the display panel 100 is coupled to the heat-dissipating member 200.

The heat-dissipating member 200 is coupled with the display panel 100 to be received inside the roller RL. In this embodiment, the constituent material of the heat-dissipating member 200 can contain a metal material such as aluminum, and the heat-dissipating member 200 includes a plate part 201, a fixing part 202, a guide part 203, and a step part 204.

The plate part 201 has a plate shape extending in a first direction DR1 that is the longitudinal direction of the roller RL. The plate part 201 is overlapped with the plurality of source circuit boards SB1, SB2, SB3, SB4, the plurality of control circuit boards CB1, CB2, and the plurality of flexible printed circuit boards 50. Therefore, the heat discharged from the plurality of source circuit boards SB1, SB2, SB3, SB4, the plurality of control circuit boards CB1, CB2, and the plurality of flexible printed circuit boards 50 can be easily transferred to the plate part 201 side, thereby implementing the heat-dissipating effect using the heat-dissipating member 200.

The fixing part 202 has a shape protruding from the plate part 201 toward the inside surface of the roller RL. The fixing part 202 is received in a through-hole 202H defined in a second side portion P2 of the roller RL. In addition, a fastening member BT is fastened to the fixing part 202 received in the through-hole 202H so that the fixing part 202 is fixed to the second side portion P2 of the roller RL. Therefore, the heat-dissipating member 200 can be fixed inside the roller RL.

In this embodiment, the fastening member BT can be a bolt having a thread on the outer circumferential surface thereof, and in this case, the fixing part 202 receives the fastening member BT and can be a pem-nut having a screw groove screw-coupled with the thread defined on the inner circumferential surface thereof.

The guide part 203 can be provided at one side edge of the plate part 201. When viewed from the cross-section, the guide part 203 has a bent shape from the plate part 201, and the outer surface of the guide part 203 has a round shape to contact the inner surface of the roller RL. In addition, the guide part 203 has a structure that is locked to a locking protrusion P3 of the roller RL, and therefore, it is easy to assemble the plate part 201 at a correct position inside the roller RL.

The step part 204 can be defined at a portion of the plate part 201 where the plurality of flexible printed circuit boards 50 are disposed. The step part 204 can have a shape protruding from the display panel 100, and the plurality of flexible printed circuit boards 50 can contact the step part 204 by a stepped shape of the step part 204. Unlike this embodiment, when the heat-dissipating member 200 does not include the step part 204, the plurality of flexible printed circuit boards 50 can be lifted from the heat-dissipating member 200 by the flexible characteristic of the plurality of the flexible printed circuit boards 50. However, in the above-described embodiment, since the plurality of flexible printed circuit boards 50 can more stably contact the step part 204 by the structure of the step part 204 of the heat-dissipating member 200, the heat discharged from the plurality of flexible printed circuit boards 50 can be easily transferred to the heat-dissipating member 200 side, thereby implementing the heat-dissipating effect using the heat-dissipating member 200.

In this embodiment, the roller RL includes the body BD, the first side portion P1, the second side portion P2, and the locking protrusion P3.

The body BD has a hollow shape, and the body BD has a shape extending in the first direction DR1. The first side portion P1 can be provided at one side of the body BD, and the first side portion P1 can be a configuration of the roller RL to be coupled with the first cover part 220. In this embodiment, when viewed from the cross-section, a first slot ST1 is defined at the first side portion P1. The heat-dissipating member 200 can be received inside the roller RL through the first slot ST1, and the display panel 100 coupled to the heat-dissipating member 200 can be received inside of the roller RL or drawn out of the roller RL through the first slot ST1.

The second side portion P2 can be provided at the other side of the body BD, and the second side portion P2 can be a configuration of the roller RL to be coupled with the second cover part 210. In addition, as described above, the second side portion P2 defines the through-hole 202H for receiving the fixing part 202 of the heat-dissipating member 200, and the through-hole 202H can have a shape of partially passing through the second side portion P2.

The first cover part 220 covers the first side portion P1. When viewed from the cross-section, the first cover part 220 defines a second slot ST2 overlapped with the first slot ST1. In this embodiment, the length and the width of the second slot ST2 can be substantially the same as the length and the width of the first slot ST1. Therefore, the heat-dissipating member 200 can be received inside the roller RL sequentially through the second slot ST2 and the first slot ST1, and the display panel 100 coupled to the heat-dissipating member 200 can be received inside the roller RL or drawn out of the roller RL through the first slot ST1 and the second slot ST2.

In this embodiment, the constituent material of the first cover part 220 can contain a metal material such as aluminum, and the first cover part 220 can contact the first side portion P1. Therefore, the heat discharged from the heat-dissipating member 200 can be transferred to the first cover part 220 side through the first side portion P1 to be discharged to the outside of the roller RL.

The second cover part 210 covers the second side portion P2. In this embodiment, the constituent material of the second cover part 210 can contain a metal material such as aluminum, and the second cover part 210 can contact the second side portion P2. Therefore, as described above, the heat transferred to the second side portion P2 side through the fixing part 202 of the heat-dissipating member 200 can be discharged to the outside of the roller RL through the second cover part 210.

In this embodiment, the outer surface of each of the first cover part 220 and the second cover part 210 has a round shape, and the body BD has the outer surface of a round shape at a remaining portion except for the first side portion P1 and the second side portion P2. Therefore, as the first cover part 220 and the second cover part 210 are coupled to the first side portion P1 and the second side portion P2, respectively, the outer surfaces having the round shape of the first cover part 220 and the second cover part 210 are connected to the outer surface having the round shape of the body BD so that the entire outer surface of the roller RL can have a round shape.

The third cover part 240 covers one side of the roller RL to cover the hollow portion of the roller RL. In addition, the third cover part 240 can be coupled with the driving part (140 in FIG. 3) to transfer the rotational force transferred from the driving part to the roller RL side. In this embodiment, the third cover part 240 can be formed with a hole coupled with the shaft of the worm wheel (144 in FIG. 4), and therefore, the rotational force of the worm wheel can be transferred to the roller RL side through the third cover part 240 so that the roller RL can be rotated.

In another embodiment, in order to more smoothly provide the rotational force provided from the driving part (140 in FIG. 3) to the roller RL side, the third cover part 240 can be coupled with a bearing (not illustrated) coupled with the shaft of the worm wheel (144 in FIG. 4), or the third cover part 240 and the bearing can also be formed integrally.

Hereinafter, a structure of the plurality of source circuit boards SB1, SB2, SB3, SB4 and the plurality of control circuit boards CB1, CB2 coupled to the heat-dissipating member 200 will be described further with reference to FIGS. 8 and 9 as follows.

Figure 8:
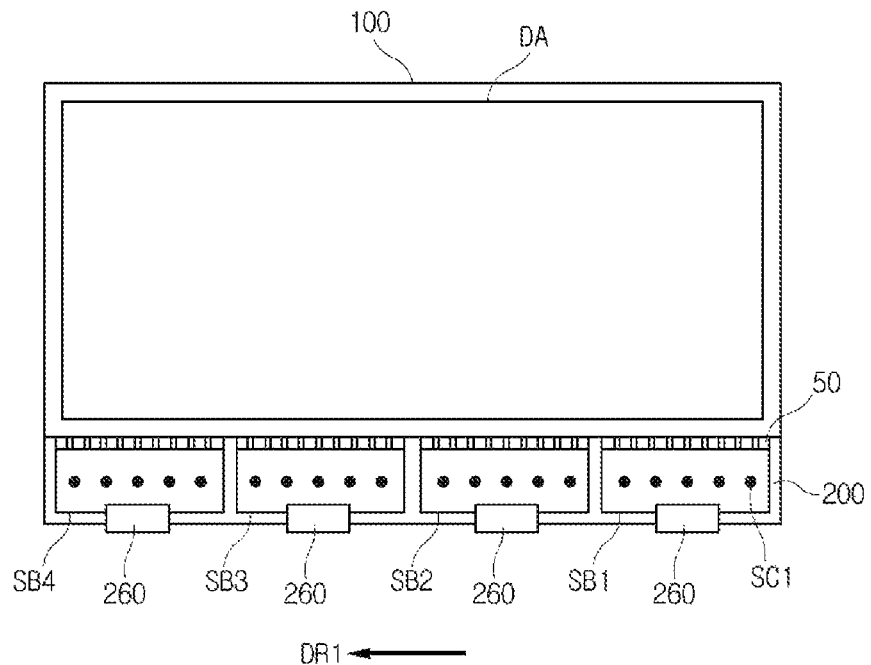
FIG. 8 is a plane diagram illustrating the plurality of source circuit boards coupled to the heat-dissipating member in the front direction of the display panel according to an embodiment of the present disclosure.
Figure 9:
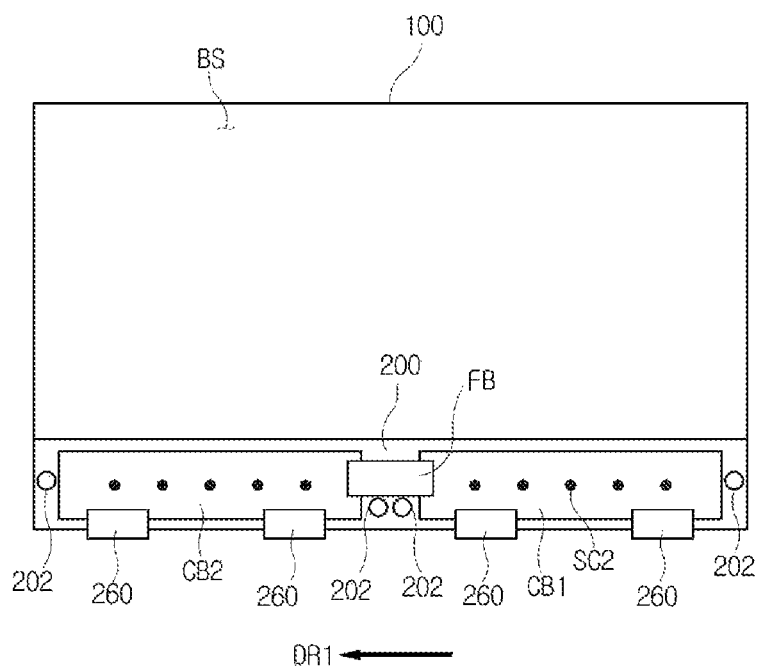
FIG. 9 is a plane diagram illustrating the plurality of control circuit boards coupled to the heat-dissipating member in the rear direction of the display panel according to an embodiment of the present disclosure.

FIG. 8 is a plane diagram illustrating the plurality of source circuit boards coupled to the heat-dissipating member in the front direction of the display panel, and FIG. 9 is a plane diagram illustrating the plurality of control circuit boards coupled to the heat-dissipating member in the rear direction of the display panel.

Referring to FIGS. 6 and 8, the heat-dissipating member 200 is coupled to one side edge of the display panel 100, and the plurality of source circuit boards SB1, SB2, SB3, SB4 are disposed on the heat-dissipating member 200 when viewed from the front direction of the display panel 100 in which the display region DA of the display panel 100 is viewed.

In this embodiment, the plurality of source circuit boards SB1, SB2, SB3, SB4 include a first source circuit board SB1, a second source circuit board SB2, a third source circuit board SB3, and a fourth source circuit board SB4. The first to fourth source circuit boards SB1, SB2, SB3, SB4 are electrically connected to terminal portions of the display panel 100 by the plurality of flexible printed circuit boards 50.

In this embodiment, although the number of source circuit boards is four in total, the present disclosure is not limited to the number of source circuit boards. For example, in another embodiment, the source circuit board can also be composed of one, and in still another embodiment, the number of the source circuit boards can also be two, three, or five or more.

In this embodiment, each of the first to fourth source circuit boards SB1, SB2, SB3, SB4 can be a printed circuit board. The first to fourth source circuit boards SB1 to SB4 generate a plurality of data signals based on the data driving control signal and the image data provided from the plurality of control circuit boards CB1, CB2, and the plurality of data signals generated from the first to fourth source circuit boards SB1 to SB4 are provided to the display panel 100 side through the plurality of flexible printed circuit boards 50 so that the display panel 100 can be used to display an image.

In this embodiment, the first to fourth source circuit boards SB1 to SB4 can be arranged to be spaced apart from each other in the first direction DR1 on the heat-dissipating member 200. A plurality of first coupling members SC1 couple the first to fourth source circuit boards SB1 to SB4 to the heat-dissipating member 200. In this embodiment, each of the plurality of first coupling members SC1 can be a screw fixed to the heat-dissipating member 200 through the corresponding source circuit board among the first to fourth source circuit boards SB1 to SB4.

Meanwhile, as the first to fourth source circuit boards SB1 to SB4 are coupled to the heat-dissipating member 200 by the plurality of first coupling members SC1, the first to fourth source circuit boards SB1 to SB4 can contact the heat-dissipating member 200. Therefore, the heat discharged from the first to fourth source circuit boards SB1 to SB4 during the driving of the display panel 100 can be easily transferred to the heat-dissipating member 200 side, thereby implementing the heat-dissipating effect using the heat-dissipating member 200.

In addition, as described above with reference to FIG. 6A, the plurality of flexible printed circuit boards 50 are overlapped with the heat-dissipating member 200 and simultaneously contact the step parts (204 in FIG. 6A) of the heat-dissipating member 200. Therefore, the heat discharged from the plurality of flexible printed circuit boards 50 during the driving of the display panel 100 can be easily transferred to the heat-dissipating member 200 side, thereby implementing the heat-dissipating effect using the heat-dissipating member 200.

Referring to FIGS. 6 and 9, the plurality of control circuit boards CB1, CB2 are disposed on the heat-dissipating member 200 when viewed from the back surface direction of the display panel 100 so that the back surface BS of the display panel 100 is viewed. That is, when the plurality of source circuit boards (SB1 to SB4 in FIG. 8) described with reference to FIG. 8 are disposed on a first surface of the heat-dissipating member 200, the plurality of control circuit boards CB1, CB2 are disposed on a second surface opposite to the first surface of the heat-dissipating member 200. Therefore, the plurality of control circuit boards CB1, CB2 can face the plurality of source circuit boards (SB1 to SB4 in FIG. 8) with the heat-dissipating member 200 interposed therebetween.

In this embodiment, the plurality of control circuit boards CB1, CB2 include a first control circuit board CB1 and a second control circuit board CB2. The first and second control circuit boards CB1, CB2 can be arranged to be spaced apart from each other in the first direction DR1 on the heat-dissipating member 200.

In this embodiment, although the number of control circuit boards is two in total, the present disclosure is not limited to the number of control circuit boards. For example, in another embodiment, the control circuit board can also be composed of one, and in still another embodiment, the number of control circuit boards can also be three or more.

The first and second control circuit boards CB1, CB2 can be electrically connected to each other through the first connection member FB. In this embodiment, the first connection member FB can be a flexible circuit board electrically connected to connectors (not illustrated) mounted at the first and second control circuit boards CB1, CB2.

In this embodiment, the first connection member FB can be overlapped with the heat-dissipating member 200 when viewed from the plane. Therefore, the heat discharged from the first connection member FB during the driving of the first and second control circuit boards CB1, CB2 can be easily transferred to the heat-dissipating member 200 side, thereby implementing the heat-dissipating effect using the heat-dissipating member 200.

In this embodiment, the first and second control circuit boards CB1, CB2 can be electrically connected to the first to fourth source circuit boards SB1, SB2, SB3, SB4 by the plurality of second connection members 260.

Each of the plurality of second connection members 260 is flexible. In this embodiment, each of the plurality of second connection members 260 can be a flexible flat cable (FFC). For example, explaining a structure of one second connection member 260 among the plurality of second connection members 260, the second connection member 260 has a shape bent from the first source circuit board SB1 to the first control circuit board CB1 side through the one side edge of the heat-dissipating member 200.

In this embodiment, each of the first and second control circuit boards CB1, CB2 can be a printed circuit board. Each of the first and second control circuit boards CB1, CB2 includes electronic components such as a power supply circuit and a timing controller, and the first and second control circuit boards CB1, CB2 generate a power supply signal and a control signal used for the display panel 100 to drive the image. In addition, the power supply signal and the control signal generated from the first and second control circuit boards CB1, CB2 are provided to the first to fourth source circuit boards SB1 to SB4 side through the plurality of second connection members 260.

In this embodiment, the first and second control circuit boards CB1, CB2 can be coupled to the heat-dissipating member 200 by the plurality of second coupling members SC2 fastened to the heat-dissipating member 200 through the first and second control circuit boards CB1, CB2. In this embodiment, each of the plurality of second coupling members SC2 can be a screw fixed to the heat-dissipating member 200 through the corresponding control circuit board among the first and second control circuit boards CB1, CB2.

As the first and second control circuit boards CB1, CB2 are coupled to the heat-dissipating member 200 by the plurality of second coupling members SC2, the first and second control circuit boards CB1, CB2 can contact the heat-dissipating member 200. Therefore, the heat discharged from the first and second control circuit boards CB1, CB2 can be easily transferred to the heat-dissipating member 200 side during the driving of the display panel 100, thereby implementing the heat-dissipating effect using the heat-dissipating member 200.

In this embodiment, the fixing part 202 described above with reference to FIGS. 6A and 6B can be provided in plural at the heat-dissipating member 200. The plurality of fixing parts 202 are spaced apart from the first control circuit board CB1, the second control circuit board CB2, and the first connection member FB when viewed from the plane. Some of the plurality of fixing parts 202 can be disposed at the edge of the heat-dissipating member 200, and the others of the plurality of fixing parts 202 can be disposed between the first and second control circuit boards CB1, CB2.

As described above, the plurality of fixing parts 202 are provided for fixing the heat-dissipating member 200 to the roller (RL in FIG. 6A), and therefore, a space for disposing the plurality of fixing parts 202 at the heat-dissipating member 200 is required to firmly fix the heat-dissipating member 200 to the roller (RL in FIG. 6A). Therefore, as described above, in this embodiment, the control circuit board can be configured to be divided in plural such as the first and second control circuit boards CB1, CB2, thereby easily securing the space where the plurality of fixing parts 202 are disposed between the first control circuit board CB1 and the second control circuit board CB2.

Figure 10:
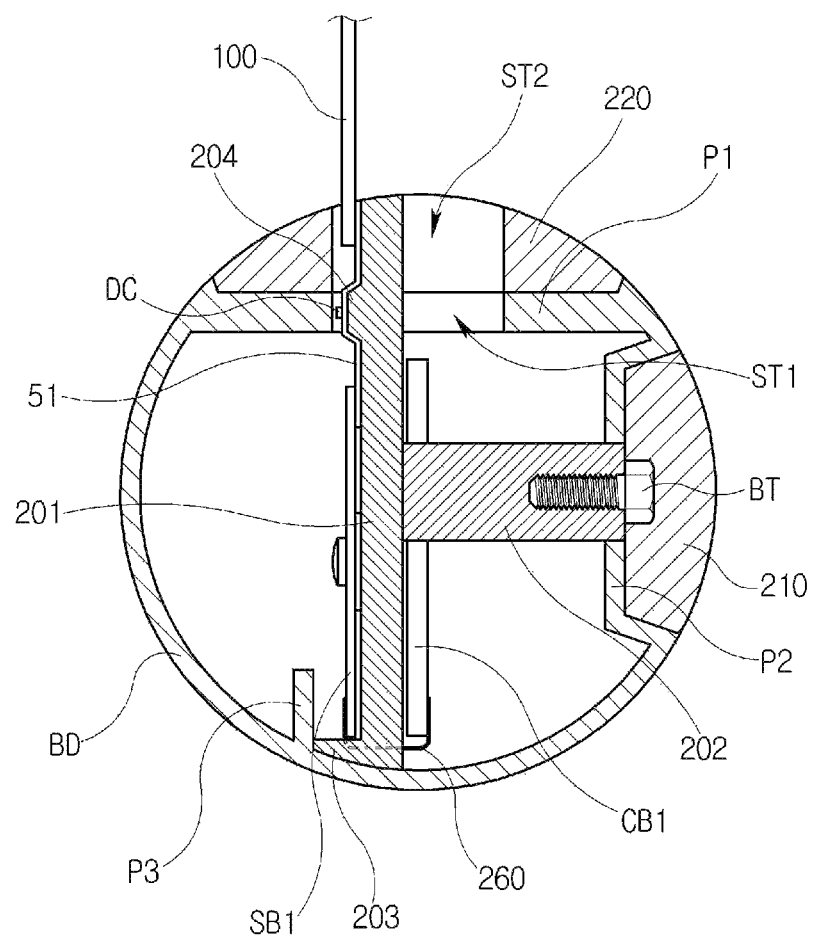
FIG. 10 is a cross-sectional diagram of a roller part and a heat-dissipating member received inside the roller part of a display device according to another embodiment of the present disclosure.

FIG. 10 is a cross-sectional diagram of a roller part and the heat-dissipating member received inside the roller part of a display device according to another embodiment of the present disclosure. Meanwhile, a position of the cut portion of the display device in FIG. 10 is the same as the position of the cut portion of the display device illustrated in FIG. 7. In addition, in the description of FIG. 10, the above-described components are denoted by the same reference numerals, and a redundant description of the components is omitted.

Referring to FIG. 10, the flexible printed circuit board 51 electrically connects the first source circuit board SB1 to the display panel 100. In this embodiment, a driving chip DC is mounted on the flexible printed circuit board 51, and the flexible printed circuit board 51 can be implemented in a Chip on film method.

In addition, the driving chip DC is mounted on the flexible printed circuit boards 51, and the driving chip DC can be disposed on the step part 204 of the heat-dissipating member. Therefore, not only the heat discharged from the flexible printed circuit board 51, but also the heat discharged from the driving chip DC during the driving of the display panel 100 can be easily transferred to the step part 204 side of the heat-dissipating member, thereby implementing the heat-dissipating effect.

According to an embodiment of the present disclosure, the source circuit boards and the control circuit boards electrically connected to the display panel can be received inside the roller. Therefore, the source circuit boards or the control circuit boards can be protected from external impacts, and the volume of the rollable display device can be slimmed.

According to an embodiment of the present disclosure, the source circuit boards and the control circuit boards are received inside the roller to be coupled to the heat-dissipating member. Therefore, the heat discharged from the source circuit boards and the control circuit boards during the driving of the rollable display device can be easily transferred to the heat-dissipating member side, thereby implementing the heat-dissipating effect using the heat-dissipating member.

In addition, in addition to the source circuit boards and the control circuit boards, since various electronic parts, such as the flexible printed circuit boards for electrically connecting the source circuit boards to the display panel, the driving chips mounted on the flexible printed circuit boards, the connection members for electrically connecting the source circuit boards with the control circuit boards, and the connection member for electrically connecting the control circuit boards are assembled with the heat-dissipating member, the heat-dissipation for the heat discharged from the electronic parts during the driving of the rollable display device can be easily performed by the heat-dissipating member.

As described above, although the present disclosure has been described with reference to the embodiments, it can be understood that various modifications and changes can be made by those skilled in the art within the spirit and scope of the present disclosure recited in the scope of the following claims.

What is claimed is:
1. A rollable display device, comprising:
a display panel having a flexible characteristic;
a roller configured to wind or unwind the display panel;
a heat-dissipating member coupled with the display panel to be received inside the roller;
a source circuit board electrically connected to the display panel, and the source circuit board disposed on the heat-dissipating member to be received inside the roller; and
a control circuit board electrically connected to the source circuit board to provide a control signal to the source circuit board, and the control circuit board disposed on the heat-dissipating member to be received inside the roller;

wherein the source circuit board is disposed on one surface of the heat-dissipating member, and the control circuit board is disposed on another surface of the heat-dissipating member to face the source circuit board.

2. The rollable display device of claim 1, wherein the heat-dissipating member has a shape extending in a longitudinal direction of the roller.

3. The rollable display device of claim 2, wherein the source circuit board is provided in plural to be arranged in the longitudinal direction of the roller.

4. The rollable display device of claim 2, wherein the control circuit board is provided in plural to be arranged in the longitudinal direction of the roller.

5. The rollable display device of claim 4, further comprising a first connection member electrically connecting two control circuit boards adjacent to each other among a plurality of control circuit boards.

6. The rollable display device of claim 5, wherein the first connection member is overlapped with the heat-dissipating member.

7. The rollable display device of claim 1, further comprising:

a first coupling member configured to couple the source circuit board to the heat-dissipating member; and a second coupling member configured to couple the control circuit board to the heat-dissipating member, wherein the source circuit board is contacted with the heat-dissipating member by the first coupling member, and the control circuit board is contacted with the heat-dissipating member by the second coupling member.

8. The rollable display device of claim 1, further comprising:

a second connection member electrically connecting the source circuit board to the control circuit board, wherein the second connection member has the flexible characteristic, and the second connection member has a shape bent from the source circuit board to the control circuit board side through one side edge of the heat-dissipating member.

9. The rollable display device of claim 8, further comprising:

a flexible printed circuit board for electrically connecting the display panel to the source circuit board, wherein the flexible printed circuit board is overlapped with the heat-dissipating member.

10. The rollable display device of claim 1, wherein the heat-dissipating member comprises:

a plate part having a shape extending in a longitudinal direction of the roller; and a fixing part having a shape protruded from the plate part to an inner surface side of the roller to be coupled with the roller.

11. The rollable display device of claim 10, wherein the roller comprises:

a body having a hollow shape;

a first side portion provided at one side of the body to define a first slot; and a second side portion provided at another side of the body, wherein a through-hole configured to receive the fixing part is defined in the second side portion.

12. The rollable display device of claim 11, further comprising:

a fastening member fastened to the fixing part received in the through-hole;

a first cover part defining a second slot corresponding to the first slot, and the first cover part configured to cover the first side portion of the body; and a second cover part configured to cover the second side portion of the body.

13. The rollable display device of claim 12, wherein an outer surface having a round shape of each of the first cover part and the second cover part is connected with an outer surface having a round shape of the body.

14. The rollable display device of claim 10, further comprising:

a flexible printed circuit board electrically connecting the display panel to the source circuit board; and a driving chip mounted on the flexible printed circuit board, wherein the heat-dissipating member further comprises a step part of a shape protruded from the plate part, and wherein the driving chip is disposed on the step part.

15. The rollable display device of claim 1, further comprising:

a driving part coupled with the roller and configured to generate a rotational force for rotating the roller; and a link part coupled with the display panel and keeping a standing state and a rolling state of the display panel.

* * * * *